(12) United States Patent
Hong

(10) Patent No.: US 11,210,250 B2
(45) Date of Patent: Dec. 28, 2021

(54) SEMICONDUCTOR APPARATUS, COMMAND TRAINING SYSTEM, AND COMMAND TRAINING METHOD

(71) Applicant: SK hynix Inc., Icheon-si (KR)

(72) Inventor: Gi Moon Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 293 days.

(21) Appl. No.: 16/113,846

(22) Filed: Aug. 27, 2018

(65) Prior Publication Data
US 2019/0278726 A1 Sep. 12, 2019

(30) Foreign Application Priority Data
Mar. 12, 2018 (KR) .................. 10-2018-0028470

(51) Int. Cl.
*G06F 13/36* (2006.01)
*G11C 7/10* (2006.01)
*G11C 7/22* (2006.01)

(52) U.S. Cl.
CPC ............ *G06F 13/36* (2013.01); *G11C 7/1084* (2013.01); *G11C 7/22* (2013.01); *G06F 2213/16* (2013.01); *G11C 2207/105* (2013.01)

(58) Field of Classification Search
CPC ... G06F 13/36; G06F 2213/16; G11C 7/1084; G11C 7/22; G11C 2207/105
USPC .......................................................... 710/5
See application file for complete search history.

(56) References Cited

U.S. PATENT DOCUMENTS

| | | | | |
|---|---|---|---|---|
| 2012/0087194 A1* | 4/2012 | Oh | .................. | G11C 7/1087 365/189.16 |
| 2013/0308401 A1* | 11/2013 | Yang | .................. | G11C 7/22 365/191 |
| 2014/0189224 A1* | 7/2014 | Kostinsky | ............ | G11C 7/1063 711/105 |
| 2015/0155013 A1* | 6/2015 | Song | .................. | G11C 29/1201 365/189.05 |
| 2016/0172013 A1* | 6/2016 | Dearth | .................... | G06F 13/00 711/106 |
| 2018/0019010 A1* | 1/2018 | Kim | .......................... | G11C 7/10 |

FOREIGN PATENT DOCUMENTS

KR 101729872 B1 4/2017

* cited by examiner

*Primary Examiner* — Idriss N Alrobaye
*Assistant Examiner* — Brooke J Taylor
(74) *Attorney, Agent, or Firm* — William Park & Associates Ltd.

(57) ABSTRACT

A semiconductor apparatus may include a command receiving circuit, a multiplexing circuit, and a DQ circuit. The command receiving circuit may be configured to latch signal bits of a command according to a clock signal, and output the latched signal bits as latched signals. The multiplexing circuit may be configured to receive the latched signals from the command receiving circuit, and selectively output the latched signals according to a flag signal which is internally generated within the semiconductor apparatus. The DQ circuit may be configured to receive the selectively outputted latched signals from the multiplexing circuit and receive the flag signal, and configured to output the selectively outputted latched signals and the flag signal as a feedback command to the outside of the semiconductor apparatus through a plurality of DQ pins.

21 Claims, 5 Drawing Sheets

| Rising Edge Mode | | | | | | | | | |
|---|---|---|---|---|---|---|---|---|---|
| CA9 | CA8 | CA7 | CA6 | CA5 | CA4 | CA3 | CA2 | CA1 | CA0 |
| EDC0 | DBI0 | DQ7 | DQ6 | DQ5 | DQ4 | DQ3 | DQ2 | DQ1 | DQ0 |

FIG.7

| CA (Rising edge of CLK : S103) | | | | | | | | |
|---|---|---|---|---|---|---|---|---|
| FLG01 | | CA7 | CA6 | CA5 | CA4 | CA3 | CA2 | CA1 | CA0 |
| EDC0 | DBI0 | DQ7 | DQ6 | DQ5 | DQ4 | DQ3 | DQ2 | DQ1 | DQ0 |

| CA (Falling edge of CLK : S106) | | | | | | | | |
|---|---|---|---|---|---|---|---|---|
| FLG10 | | CA7 | CA6 | CA5 | CA4 | CA3 | CA2 | CA1 | CA0 |
| EDC0 | DBI0 | DQ7 | DQ6 | DQ5 | DQ4 | DQ3 | DQ2 | DQ1 | DQ0 |

| CA (Rising and falling edge of CLK : S109) | | | | | | | | |
|---|---|---|---|---|---|---|---|---|
| FLG11 | | CA9 | | CA8 | | CABI | | | |
| EDC0 | DBI0 | DQ7 | DQ6 | DQ5 | DQ4 | DQ3 | DQ2 | DQ1 | DQ0 |

SEMICONDUCTOR APPARATUS, COMMAND TRAINING SYSTEM, AND COMMAND TRAINING METHOD

CROSS-REFERENCES TO RELATED APPLICATION

The present application claims priority under 35 U.S.C. § 119(a) to Korean application number 10-2018-0028470, filed on Mar. 12, 2018, in the Korean Intellectual Property Office, which is incorporated herein by reference in its entirety.

BACKGROUND

1. Technical Field

Various embodiments generally relate to a semiconductor circuit, and more particularly, to a semiconductor apparatus, a command training system, and command training system method.

2. Related Art

With the increase in operating speed of a data processing system, a training function for checking whether a slave (or semiconductor memory) accurately receives a command provided from a master (or controller) has been applied to the data processing system.

A semiconductor apparatus only receives a command through a command and address (CA) pin or address pin in which a command and address are integrated, but does not include a transmitting circuit for transmitting a command to a controller.

Therefore, in order to perform command training, the semiconductor apparatus must feed back the received command to the controller using a data input/output circuit, which is hereinafter referred to as a DQ circuit circuit for transmitting/receiving data.

At this time, when the number of feedback signals which the semiconductor apparatus must transmit is larger than the number of DQ pins of the DQ circuit, the semiconductor apparatus needs to sequentially transmit the feedback signals using a predetermined control signal.

The conventional semiconductor apparatus sequentially transmits the feedback signals using setting information of a mode register set (MRS) as the control signal.

As illustrated in FIG. 1, the conventional semiconductor apparatus may perform command training through three steps such as a rising edge mode S1, a falling edge mode S2, and a rising & falling edge mode S3.

The rising edge mode S1 indicates a mode in which a memory feeds back a received command based on a rising edge of a clock signal.

The falling edge mode S2 indicates a mode in which the memory feeds back a received command based on a falling edge of the clock signal.

The rising & falling edge mode S3 indicates a mode in which the memory receives signal bits which were not fed back, among signal bits constituting a command, based on rising and falling edges of the clock signal, and feeds back the received signal bits.

The semiconductor apparatus must perform MRS setting and command transmission/reception in each of the rising edge mode S1, the falling edge mode S2, and the rising & falling edge mode S3.

That is, in the rising edge mode S1 as illustrated in FIG. 2, the memory sets the MRS to receive a command based on a rising edge of the clock signal, according to an instruction of a controller, at step S11.

Then, the controller transmits the command CMD to the memory at step S12.

The memory receives the command at step S13.

Then, the memory feeds back the received command to the controller at step S14.

At this time, as illustrated in FIG. 3, signal bits CA0 to CA9 of the command CMD may be fed back through pins DQ0 to EDC0, respectively.

The controller receives the command fed back from the memory at step S15.

Then, the controller determines whether training was ended, at step S16. When the training is not ended, the controller adjusts the timing or swing range of the command at step S17, and transmits the adjusted command to the memory at step S12.

When a desired result is detected by repeating the above-described steps S12 to S16, the controller ends the training.

As described above, the conventional semiconductor apparatus must repeatedly perform the MRS setting and command transmission/reception in the rising edge mode S1, the falling edge mode S2, and the rising & falling edge mode S3 when performing the rising edge mode S1, the falling edge mode S2, and the rising & falling edge mode S3.

Basically, the MRS needs to be operated at low speed until the command training is ended, and the controller controls the memory to change the MRS setting. Thus, the MRS setting requires a lot of time, and the command transmission/reception also requires a lot of time. Therefore, the command training time is significantly increased.

SUMMARY

In an embodiment, a semiconductor apparatus may include a command receiving circuit, a multiplexing circuit, and a DQ circuit. The command receiving circuit may be configured to latch signal bits of a command according to a clock signal, and output the latched signal bits as latched signals. The multiplexing circuit may be configured to receive the latched signals from the command receiving circuit, and selectively output the latched signals according to a flag signal which is internally generated within the semiconductor apparatus. The DQ circuit may be configured to receive the selectively outputted latched signals from the multiplexing circuit and receive the flag signal, and configured to output the selectively outputted latched signals and the flag signal as a feedback command to the outside of the semiconductor apparatus through a plurality of DQ pins.

In an embodiment, a command training system may include a controller and a semiconductor apparatus. The controller may be configured to generate a command and clock signal, and configured to control command training according to a feedback command. The semiconductor apparatus may be configured to add an internally generated flag signal to signals obtained by latching signal bits of the command according to the clock signal, and provide the resultant signal as the feedback command to the controller.

In an embodiment, a command training method of a controller and semiconductor apparatus may be provided. The method may include providing, by the controller, a command and clock signal to the semiconductor apparatus. The method may also include generating, by the semiconductor apparatus, latch signals by latching the command according to the clock signal. The method may further include changing, by the semiconductor apparatus, the value of a flag signal in a predetermined cycle, adding the flag signal changed in each cycle to a set of the latch signals, and providing the resultant signal as a feedback command to the controller. The method may additionally include controlling, by the controller, command training according to the feedback command.

BRIEF DESCRIPTION OF THE DRAWINGS

FIG. 7 illustrates a command mapping table for each output pin based on FIG. 6.

DETAILED DESCRIPTION

Hereinafter, a semiconductor apparatus and a command training system and method according to the present disclosure will be described below with reference to the accompanying drawings through examples of embodiments.

Various embodiments may be directed to a semiconductor apparatus and a command training system and method, which can reduce training time.

Figure 4:
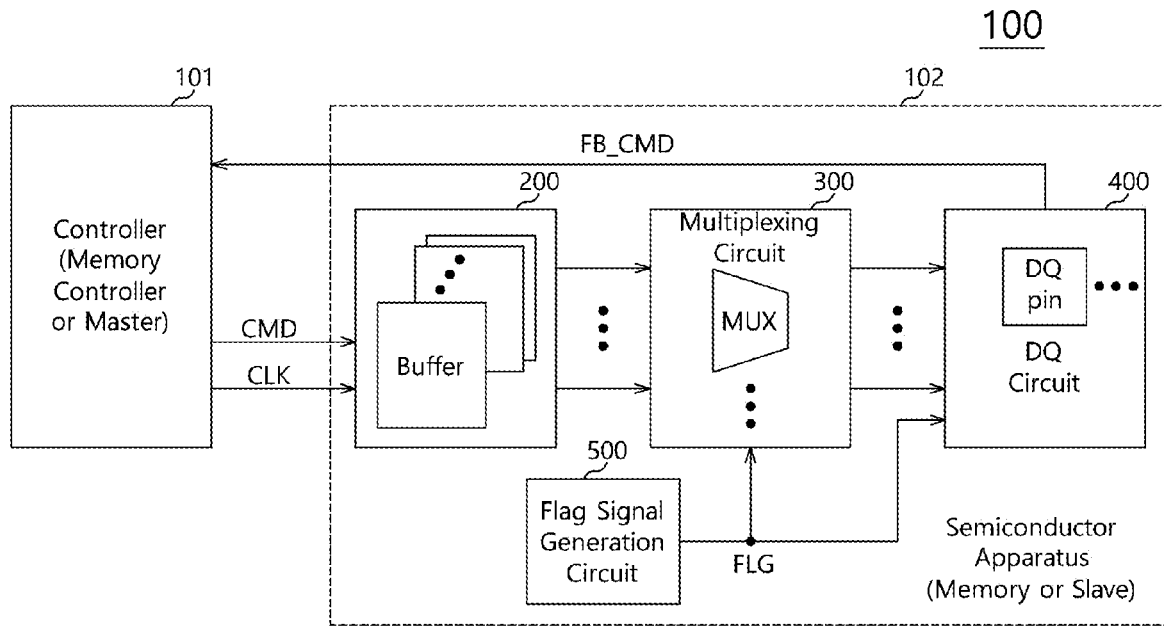
FIG. 4 is a diagram illustrating the configuration of a command training system 100 in accordance with an embodiment.

FIG. 4 is a diagram illustrating the configuration of a command training system 100 in accordance with an embodiment.

As illustrated in FIG. 4, the command training system 100 in accordance with an embodiment may include a controller (memory controller or master) 101 and a semiconductor apparatus (memory or slave) 102.

The controller 101 may include a graphic processing unit (GPU), central processing unit (CPU), etc.

The controller 101 may generate a command CMD and clock signal CLK, and provide the command CMD and the clock signal CLK to the semiconductor apparatus 102.

The controller 101 may control command training according to a feedback command FB_CMD.

The controller 101 may monitor a training result, and provide the command CMD having a timing or swing range adjusted through the training result to the semiconductor apparatus 102, in order to control the command training.

The semiconductor apparatus 102 may include a command receiving circuit 200, a multiplexing circuit 300, a DQ circuit 400, and a flag signal generation circuit 500.

The command receiving circuit 200 may latch signal bits CA0~ of the received command CMD at rising and falling edges of the clock signal CLK, and output the latched signal bits. The command receiving circuit 200 may output the latched signal bits as latched signals.

The command receiving circuit 200 may include a plurality of buffers.

The plurality of buffers may be divided into a first buffer group configured to latch the signal bits CA0~ of the command CMD at the rising edges of the clock signal CLK and a second buffer group configured to latch the signal bits CA0~ of the command CMD at the falling edges of the clock signal CLK.

The multiplexing circuit 300 may receive the output signals of the command receiving circuit 200 (e.g., the latched signal bits as the latched signals) and receive a flag signal FLG. The multiplexing circuit 300 may selectively output the output signals of the command receiving circuit 200 according to the flag signal FLG.

The multiplexing circuit 300 may include a plurality of multiplexers MUX.

Each of the multiplexers MUX may select between an output of any one buffer of the first buffer group and an output of any one buffer of the second buffer group according to the flag signal FLG.

The DQ circuit 400 may receive outputs of the multiplexing circuit 300 (e.g., the selectively outputted latched signals) and receive the flag signal FLG. The DQ circuit 400 may provide the outputs of the multiplexing circuit 300 and the flag signal FLG as a feedback command FB_CMD to the controller 101 through a plurality of DQ pins.

The flag signal generation circuit 500 may generate the flag signal FLG.

The flag signal FLG may define to which signals among the signal bits CA0~ of the command CMD the signals outputted from the multiplexing circuit 300 correspond, and/or define at which edges between the rising and falling edges of the clock signal CLK the signals outputted from the multiplexing circuit 300 were latched.

Figure 5A:
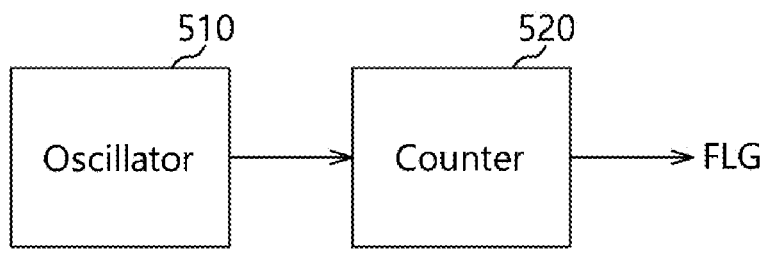
FIGS. 5A and 5B are diagrams illustrating configurations of a flag signal generation circuit of FIG. 4.

FIG. 5A illustrates a configuration of the flag signal generation circuit 500 of FIG. 4 in accordance with an embodiment.

As illustrated in FIG. 5A, the flag signal generation circuit 500 may include an oscillator 510 and a counter 520.

The oscillator 510 may generate an oscillation signal.

The counter 520 may count the oscillation signal outputted from the oscillator 510, and output the count value as the flag signal FLG having a predetermined number of bits, for example, two bits.

FIG. 5A illustrates an example of the flag signal generation circuit 500.

Figure 5B:
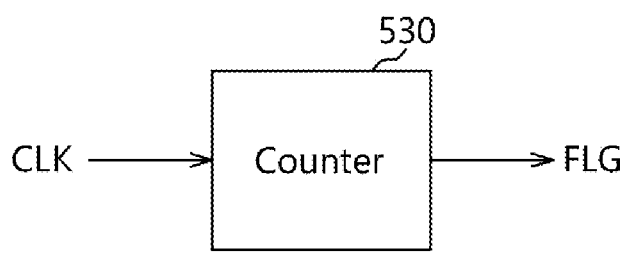

FIG. 5B illustrates a configuration of the flag signal generation circuit 500 of FIG. 4 in accordance with an embodiment. The flag signal generation circuit 500 may generate the flag signal FLG by directly counting the clock signal CLK.

As illustrated in FIG. 5B, the flag signal generation circuit may include a counter 530.

The counter 530 may directly count the clock signal CLK, and output the count value as the flag signal FLG having a predetermined number of bits, for example, two bits.

The word "predetermined" as used herein with respect to, such as, a predetermined number, cycle, or format means that a predetermined number, cycle, or format may be determined prior to being used in a process or algorithm. For some embodiments, the predetermined number, cycle, or format may be determined before the process or algorithm begins. In other embodiments, the predetermined number, cycle, or format may be determined during the process or algorithm but before the predetermined number, cycle, or format is used in the process or algorithm.

A command training method in accordance with an embodiment may include a step in which the controller 101 provides the command and the clock signal CLK to the semiconductor apparatus 102; a step in which the semiconductor apparatus 102 generates latch signals by latching the command according to the clock signal CLK; a step in which the semiconductor apparatus 102 changes the value of the flag signal FLG in each predetermined cycle, adds the flag signals FLG changed in the respective cycles to respective sets of the latch signals, and provides the resultant signal as the feedback command FB_CMD to the controller 101; and a step in which the controller 101 controls command training according to the feedback command FB_CMD. The command training method will be described in detail with reference to FIGS. 6 and 7.

Figure 6:
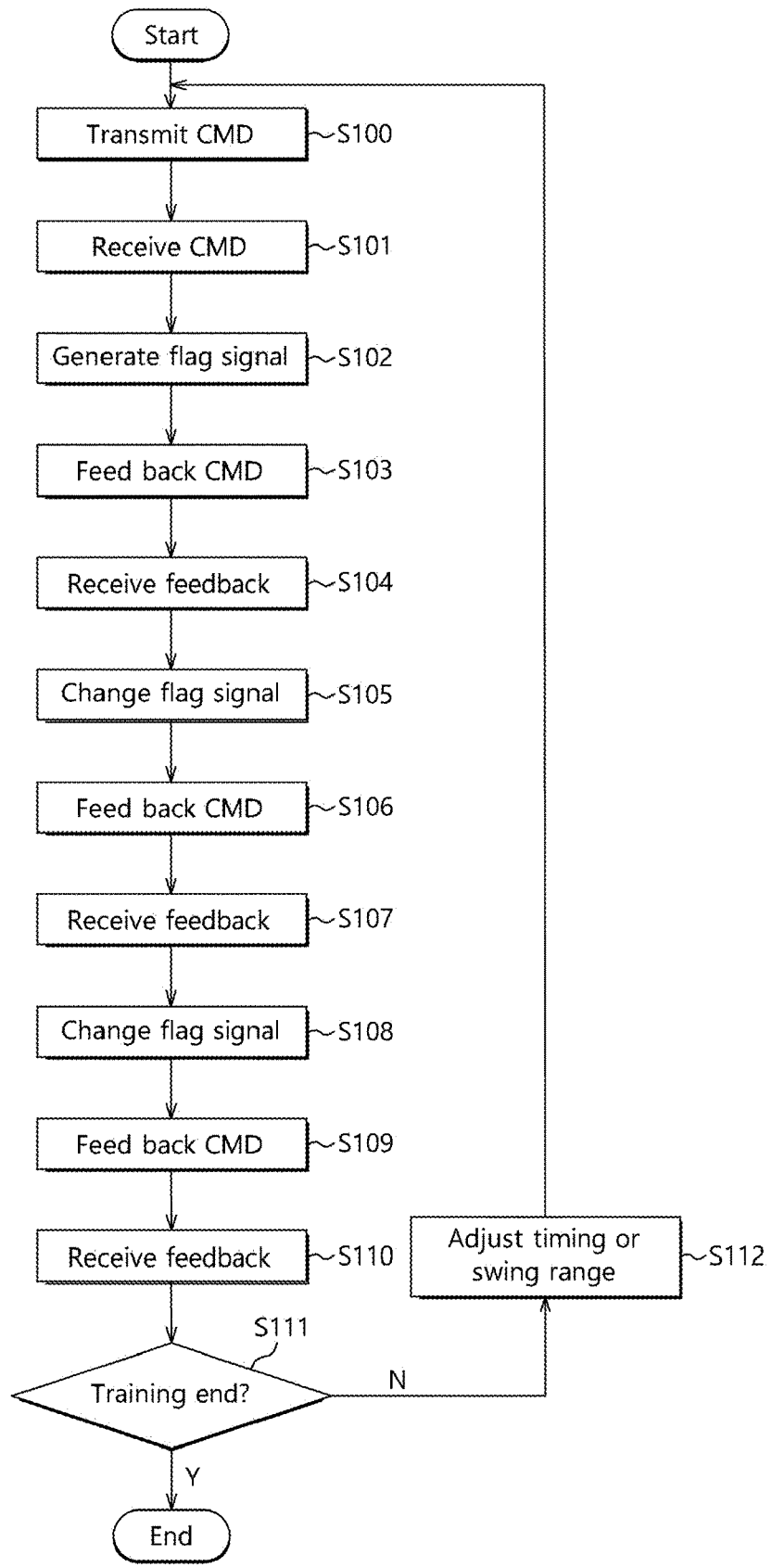
FIG. 6 is a flowchart illustrating a command training method in accordance with an embodiment.

FIG. 6 is a flowchart illustrating the command training method in accordance with an embodiment, and FIG. 7 is a command mapping table for each output pin based on FIG. 6 in accordance with an embodiment.

The controller 101 may transmit a command to the semiconductor apparatus 102 at step S100.

The semiconductor apparatus 102 may receive the command at step S101.

Then, the semiconductor apparatus 102 may generate a flag signal FLG '01' at step S102.

The semiconductor apparatus 102 may add the flag signal FLG '01' to a command latched at rising edges of the clock signal CLK, and feed back the resultant signal as a feedback command FB_CMD to the controller 101 at step S103.

At this time, as illustrated in FIG. 7, signal bits CA0 to CA7 of the command CMD and the flag signal FLG '01' (i.e., FLG01) may be fed back through pins DQ0 to EDC0 at step S103.

The controller 101 may receive the feedback command FB_CMD provided from the semiconductor apparatus 102 at step S104.

At this time, according to the flag signal FLG '01' of the feedback command FB_CMD, the controller 101 may recognize that the other signals of the feedback command FB_CMD are the signal bits CA0 to CA7 of the command latched at rising edges of the clock signal CLK.

Then, the semiconductor apparatus 102 may change the flag signal FLG '01' at step S105.

The semiconductor apparatus 102 may add the changed flag signal FLG '10' to a command latched at falling edges of the clock signal CLK, and feed back the resultant signal as the feedback command FB_CMD to the controller 101 at step S106.

At this time, as illustrated in FIG. 7, the signal bits CA0 to CA7 of the command CMD and the changed flag signal FLG '10' (i.e., FLG10) may be fed back through the pins DQ0 to EDC0 at step S106.

The controller 101 may receive the feedback command FB_CMD provided from the semiconductor apparatus 102 at step S107.

At this time, according to the flag signal FLG '10' of the feedback command FB_CMD, the controller 101 may recognize that the other signals of the feedback command FB_CMD are the signal bits CA0 to CA7 of the command latched at falling edges of the clock signal CLK.

The semiconductor apparatus 102 may change the flag signal FLG '10' once more in order to feed back the other signal bits (for example, CA8 and CA9) which were not fed back through the two feedback processes (i.e., the feedback processes above according to flag signals FLG '01' and FLG '10'), among the signal bits of the command, at step S108.

Then, the semiconductor apparatus 102 may add the changed flag signal FLG '11' to the signal bits CA8 and CA9 of the command, latched at rising and falling edges of the clock signal CLK, respectively, and feed back the resultant signal as the feedback command FB_CMD to the controller 101 at step S109.

At this time, as illustrated in FIG. 7, the signal bits CA8 and CA9 of the command CMD and the changed flag signal FLG '11' (i.e., FLG11) may be fed back through the pins DQ0 to EDC0 at step S109.

Furthermore, command and address bus inversion (CABI) related to data bus inversion (DBI) may also be latched at rising and falling edges of the clock signal CLK, and included as a signal bit of the command CMD in the feedback command FB_CMD.

The controller 101 may receive the feedback command FB_CMD provided from the semiconductor apparatus 102 at step S110.

At this time, according to the flag signal FLG '11' of the feedback command FB_CMD, the controller 101 may recognize that the other signals of the feedback command FB_CMD are the signal bits CA8 and CA9 of the command, latched at rising and falling edges of the clock signal CLK, respectively.

Then, the controller 101 may determine whether to end the training at step S111. When the training is not ended, the controller 101 may adjust the timing or swing range of the command at step S112, and transmit the adjusted command to the memory at step S100.

The controller 101 may end the training when detecting a desired result by repeating the above-described steps S100 to S111.

Figure 1:
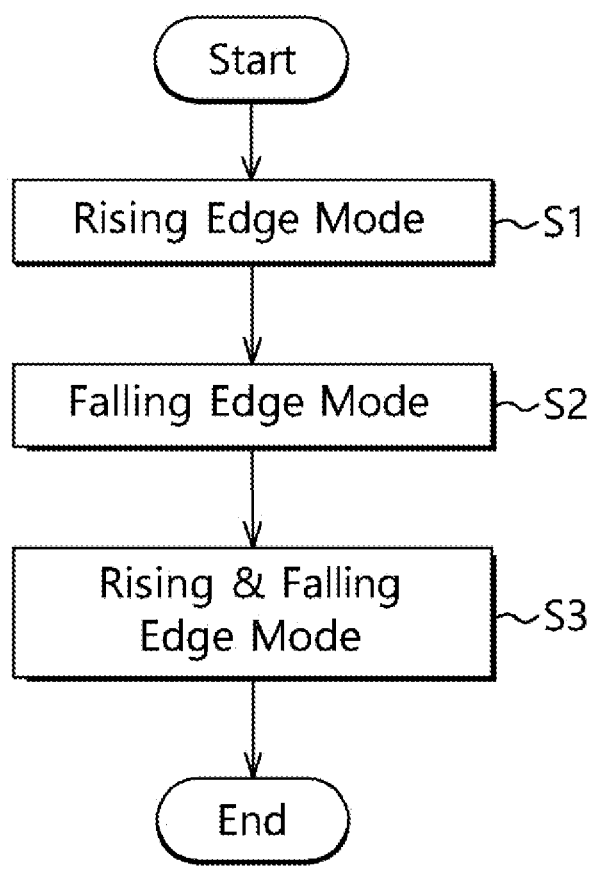
FIGS. 1 and 2 are flowcharts illustrating a conventional command training method.
Figures 2, 3:
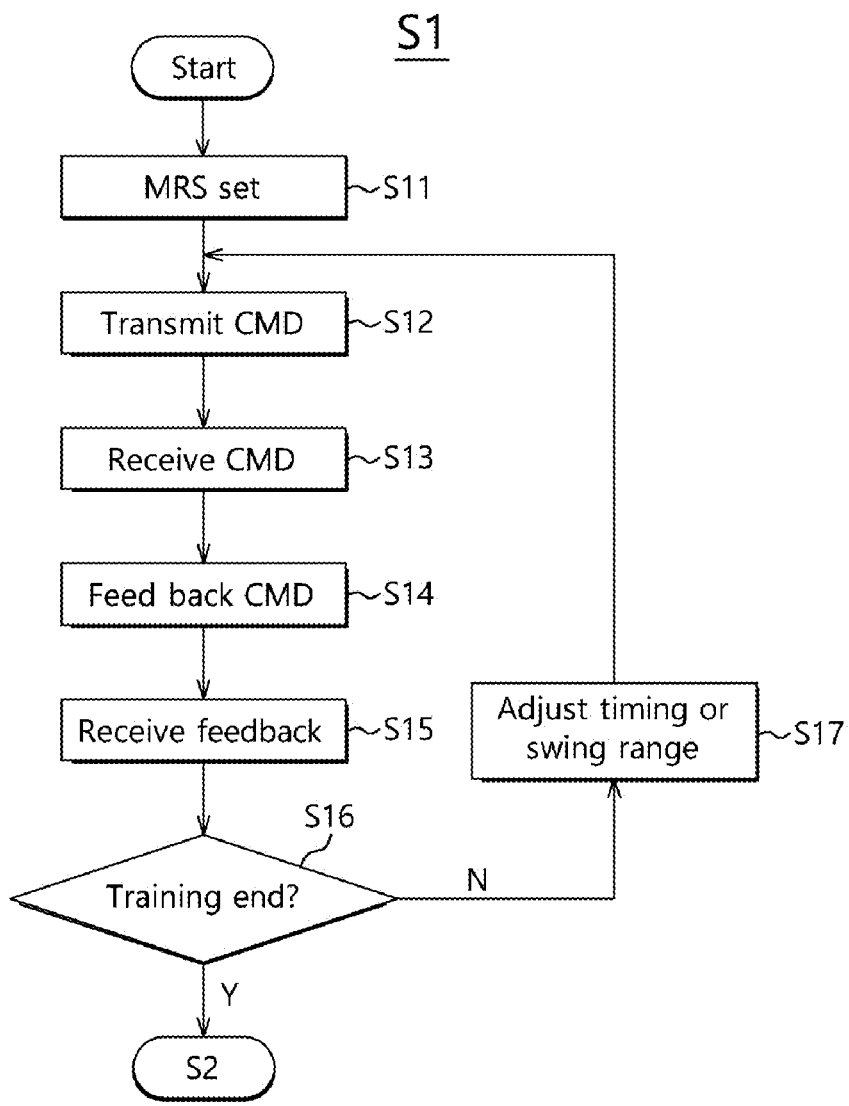
FIG. 3 illustrates a command mapping table for each output pin based on FIG. 2.

In some embodiments, the command receiving step S100 and the command transmitting step S101 may be performed only once. In other embodiments the command receiving step S100 and the command transmitting step S101 may be performed more than once. Thus, comparing to the related art of FIGS. 1 and 2, an MRS setting step or steps may be omitted. Therefore, the command training time of the present embodiments may be significantly reduced.

In an embodiment, three feedback processes S102 to S109 may be required in order to latch all the signal bits of the command at rising and falling edges of the clock signal CLK and to feed back the feedback command. However, the number of feedback processes can be decreased or increased depending on the number of signal bits contained in the command.

Furthermore, the values '01', '10' and '11' of the flag signal FLG may be only examples based on an embodiment. The controller 101 and the semiconductor apparatus may previously decide the format (i.e., predetermined format) related to the flag signal FLG in connection with the command training, and use the flag signal FLG corresponding to a predetermined bit number (or/and value).

While various embodiments have been described above, it will be understood to those skilled in the art that the embodiments described are examples only. Accordingly, the operating method of a data storage device described herein should not be limited based on the described embodiments.

What is claimed is:

1. A semiconductor apparatus comprising:
a command receiving circuit configured to be coupled to a controller and configured to receive latch signal bits of a command from said controller, responsive to a clock signal received from the controller, the command receiving circuit being additionally configured to output the latched signal bits as latched signals;
a multiplexing circuit coupled to the command receiving circuit and configured to receive the latched signals from the command receiving circuit, and selectively output the latched signals according to a flag signal, which is internally generated within the semiconductor apparatus; and
a data input/output circuit coupled to the multiplexing circuit and configured to receive the selectively outputted latched signals from the multiplexing circuit and receive the flag signal, and additionally configured to output the selectively outputted latched signals and the flag signal as a feedback command to the controller through a plurality of DQ pins;

wherein, the controller is configured to adjust timing of the command that the controller provides to the command receiving circuit, responsive to the feedback command received by the controller from the data input/output circuit.

2. The semiconductor apparatus according to claim 1, further comprising a flag signal generation circuit configured to generate the flag signal.

3. The semiconductor apparatus according to claim 2, wherein the flag signal generation circuit comprises a counter configured to count the clock signal and output the count value as the flag signal.

4. The semiconductor apparatus according to claim 2, wherein the flag signal generation circuit comprises: an oscillator; and a counter configured to count an output of the oscillator and output the count value as the flag signal.

5. The semiconductor apparatus according to claim 1, wherein the command receiving circuit comprises: a first buffer group configured to latch the signal bits of the command at rising edges of the clock signal; and a second buffer group configured to latch the signal bits of the command at falling edges of the clock signal.

6. The semiconductor apparatus according to claim 5, wherein the multiplexing circuit comprises a plurality of multiplexers configured to select between an output of the first buffer group and an output of the second buffer group according to the flag signal.

7. The semiconductor apparatus according to claim 1, wherein the flag signal defines to which signal bits, among the signal bits of the command, the selectively outputted latched signals from the multiplexing circuit correspond, and wherein the flag signal defines at which edges between the rising and falling edges of the clock signal the selectively outputted latched signals from the multiplexing circuit were latched.

8. The semiconductor apparatus according to claim 1, wherein the multiplexing circuit selectively outputting the latched signals comprises: selectively outputting a first set of the latched signals according to a first flag signal which is internally generated within the semiconductor apparatus; selectively outputting a second set of the latched signals according to a second flag signal which is internally generated within the semiconductor apparatus; and selectively outputting a remaining set of the latched signals according to a third flag signal which is internally generated within the semiconductor apparatus.

9. The semiconductor apparatus according to claim 8, wherein the DQ circuit outputting the selectively outputted latched signals and the flag signal as the feedback command comprises: outputting the first set of the latched signals and the first flag signal as a first feedback signal to the outside of the semiconductor apparatus through the plurality of DQ pins; outputting the second set of the latched signals and the second flag signal as a second feedback signal to the outside of the semiconductor apparatus through the plurality of DQ pins; and outputting the remaining set of the latched signals and the third flag signal as a third feedback signal to the outside of the semiconductor apparatus through the plurality of DQ pins.

10. A command training system comprising:
a controller configured to generate a command and clock signal, and configured to control command training according to a feedback command; and a semiconductor apparatus coupled to the controller and which is configured to add an internally generated flag signal to signals obtained by latching signal bits of the command from the controller responsive to the clock signal, and provide the resultant signal as the feedback command to the controller;

wherein the semiconductor apparatus comprises:
a command receiving circuit coupled to the controller and configured to receive latch signal bits of a command from said controller responsive to a clock signal received by the command receiving circuit from said controller, the command receiving circuit being additionally configured to output the latched signal bits as latched signals;

a multiplexing circuit coupled to the command receiving circuit and configured to receive the latched signals from the command receiving circuit, and selectively output the latched signals according to a flag signal, which is internally generated within the semiconductor apparatus; and a data input/output circuit coupled to the multiplexing circuit and configured to receive the selectively outputted latched signals from the multiplexing circuit and receive the flag signal, and additionally configured to output the selectively outputted latched signals and the flag signal as a feedback command to the outside of the semiconductor apparatus controller through a plurality of DQ pins.

11. The command training system according to claim 10, wherein the flag signal defines to which signal bits, among the signal bits of the command, the signals latched according to the clock signal correspond, and wherein the flag signal defines at which edges between the rising and falling edges of the clock signal the signals latched according to the clock signal were latched.

12. The command training system according to claim 10, wherein the controller monitors a training result according to the feedback command, and provides the command having a timing or swing range adjusted based on the training result to the semiconductor apparatus, to control the command training.

13. The command training system according to claim 10, wherein the semiconductor apparatus comprises:
a command receiving circuit configured to latch the signal bits of the command according to the clock signal, and output the latched signal bits as the latched signals;
a multiplexing circuit coupled to the command receiving circuit and which is configured to receive the latched signals from the command receiving circuit, and selectively output the latched signals according to the flag signal;
and a data input/output circuit coupled to the multiplexing circuit and which is configured to receive the selectively outputted latched signals from the multiplexing circuit and receive the flag signal, and configured to provide the selectively outputted latched signals and the flag signal as the feedback command to the controller through a plurality of DQ pins.

14. The command training system according to claim 13, further comprising a flag signal generation circuit configured to generate the flag signal.

15. The command training system according to claim 14, wherein the flag signal generation circuit comprises a counter configured to count the clock signal and output the count value as the flag signal.

16. The command training system according to claim 14, wherein the flag signal generation circuit comprises: an oscillator; and a counter configured to count an output of the oscillator and output the count value as the flag signal.

17. The command training system according to claim 13, wherein the command receiving circuit comprises: a first buffer group configured to latch the signal bits of the command at rising edges of the clock signal; and a second buffer group configured to latch the signal bits of the command at falling edges of the clock signal.

18. The command training system according to claim 17, wherein the multiplexing circuit comprises a plurality of multiplexers configured to select between an output of the first buffer group and an output of the second buffer group according to the flag signal.

19. A command training method for a controller and semiconductor apparatus, comprising the steps of:
providing, by the controller, a command and clock signal to the semiconductor apparatus;
generating, by the semiconductor apparatus, latch signals by latching the command according to the clock signal;
changing, by the semiconductor apparatus, the value of a flag signal in a predetermined cycle, adding the flag signal changed in each cycle to a set of the latch signals, and providing the resultant signal as a feedback command to the controller; and
controlling, by the controller, command training according to the feedback command;
wherein, the controller adjusts timing of the command that the controller provides to the semiconductor apparatus responsive to the feedback command received by the controller from the semiconductor apparatus.

20. The command training method according to claim 19, wherein the semiconductor apparatus internally generates the flag signal according to a predetermined format in relation to the controller and command training.

21. The command training method according to claim 19, wherein the step of controlling command training according to the feedback command comprises the step of monitoring, by the controller, a training result according to the feedback command and providing the command having a timing or swing range adjusted based on the training result to the semiconductor apparatus, to control the command training.

* * * * *